United States Patent
Cunningham et al.

(10) Patent No.: US 9,269,442 B2
(45) Date of Patent: Feb. 23, 2016

(54) DIGITAL CONTROL FOR REGULATION OF PROGRAM VOLTAGES FOR NON-VOLATILE MEMORY (NVM) SYSTEMS

(71) Applicants: Jeffrey C. Cunningham, Austin, TX (US); Ross S. Scouller, Austin, TX (US); Christopher N. Hume, Kyle, TX (US)

(72) Inventors: Jeffrey C. Cunningham, Austin, TX (US); Ross S. Scouller, Austin, TX (US); Christopher N. Hume, Kyle, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 122 days.

(21) Appl. No.: 14/185,454

(22) Filed: Feb. 20, 2014

(65) Prior Publication Data

US 2015/0235704 A1    Aug. 20, 2015

(51) Int. Cl.
*G11C 16/30* (2006.01)
*G11C 16/10* (2006.01)
*G11C 16/08* (2006.01)

(52) U.S. Cl.
CPC ............... *G11C 16/10* (2013.01); *G11C 16/08* (2013.01)

(58) Field of Classification Search
CPC ...................................................... G11C 16/30
USPC .................................................... 365/185.18
See application file for complete search history.

(56) References Cited

U.S. PATENT DOCUMENTS

| | | | |
|---|---|---|---|
| 5,430,674 | A | 7/1995 | Javanifard |
| 5,537,350 | A | 7/1996 | Larsen et al. |
| 5,726,944 | A | 3/1998 | Pelley, III et al. |
| 5,907,700 | A | 5/1999 | Talreja et al. |
| 7,952,937 | B2 | 5/2011 | Bode |
| 2001/0011886 | A1 | 8/2001 | Kobayashi |
| 2002/0097627 | A1 | 7/2002 | Sacco et al. |

(Continued)

OTHER PUBLICATIONS

Cunningham et al., "Sector Based Regulation of Program Voltages for Non-Volatile Memory (NVM) Systems", U.S. Appl. No. 14/050,962, filed Oct. 10, 2013, 23 pgs.

(Continued)

*Primary Examiner* — Min Huang
(74) *Attorney, Agent, or Firm* — Egan, Peterman, Enders & Huston (57) ABSTRACT

Methods and systems are disclosed for digital control for regulation of program voltages for non-volatile memory (NVM) systems. The disclosed embodiments dynamically adjust program voltages based upon parameters associated with the cells to be programmed in order to account for IR (current-resistance) voltage drops that occur within program voltage distribution lines. Other voltage variations can also be accounted for with these dynamic adjustments, as well. The parameters for cells to be programmed can include, for example, cell address locations for the cells to be programmed, the number of cells to be programmed, and/or other desired parameters associated with the cells to be programmed. The disclosed embodiments use digital control values obtained from lookup tables based upon the cell parameters to adjust output voltages generated by voltage generation circuit blocks used to program the selected cells thereby tuning the program output voltage level to a predetermined desired level.

18 Claims, 6 Drawing Sheets

(56) References Cited

U.S. PATENT DOCUMENTS

| | | | |
|---|---|---|---|
| 2003/0151949 A1 | 8/2003 | Micheloni et al. | |
| 2005/0226079 A1* | 10/2005 | Zhu et al. | 365/230.03 |
| 2007/0121382 A1* | 5/2007 | Chan et al. | 365/185.19 |
| 2007/0189098 A1* | 8/2007 | Hsieh | 365/226 |
| 2009/0016116 A1* | 1/2009 | Lo et al. | 365/185.22 |
| 2009/0175112 A1* | 7/2009 | Ang et al. | 365/226 |
| 2013/0265828 A1 | 10/2013 | Cunningham et al. | |
| 2015/0003163 A1* | 1/2015 | Shirota | 365/185.17 |

OTHER PUBLICATIONS

Notice of Allowance mailed Jan. 16, 2015, from Cunningham et al., "Sector Based Regulation of Program Voltages for Non-Volatile Memory (NVM) Systems", U.S. Appl. No. 14/050,962, filed Oct. 10, 2013, 10 pgs.

* cited by examiner

DIGITAL CONTROL FOR REGULATION OF PROGRAM VOLTAGES FOR NON-VOLATILE MEMORY (NVM) SYSTEMS

TECHNICAL FIELD

The technical field relates to generation and application of program voltages for arrays of non-volatile memory (NVM) cells within NVM systems.

BACKGROUND

Non-volatile memory (NVM) systems include arrays of NVM cells that are programmed using program bias voltages applied to program nodes. NVM systems can also be embedded within other integrated circuits, such as for example, microcontrollers and/or microprocessors. Many NVM systems, including embedded NVM systems, utilize smart program biasing and erase biasing where program/erase bias voltages are ramped, stepped and/or pulsed from a low voltage bias level to a higher voltage bias level in order to minimize stress to cells within the NVM array.

Figure 1:
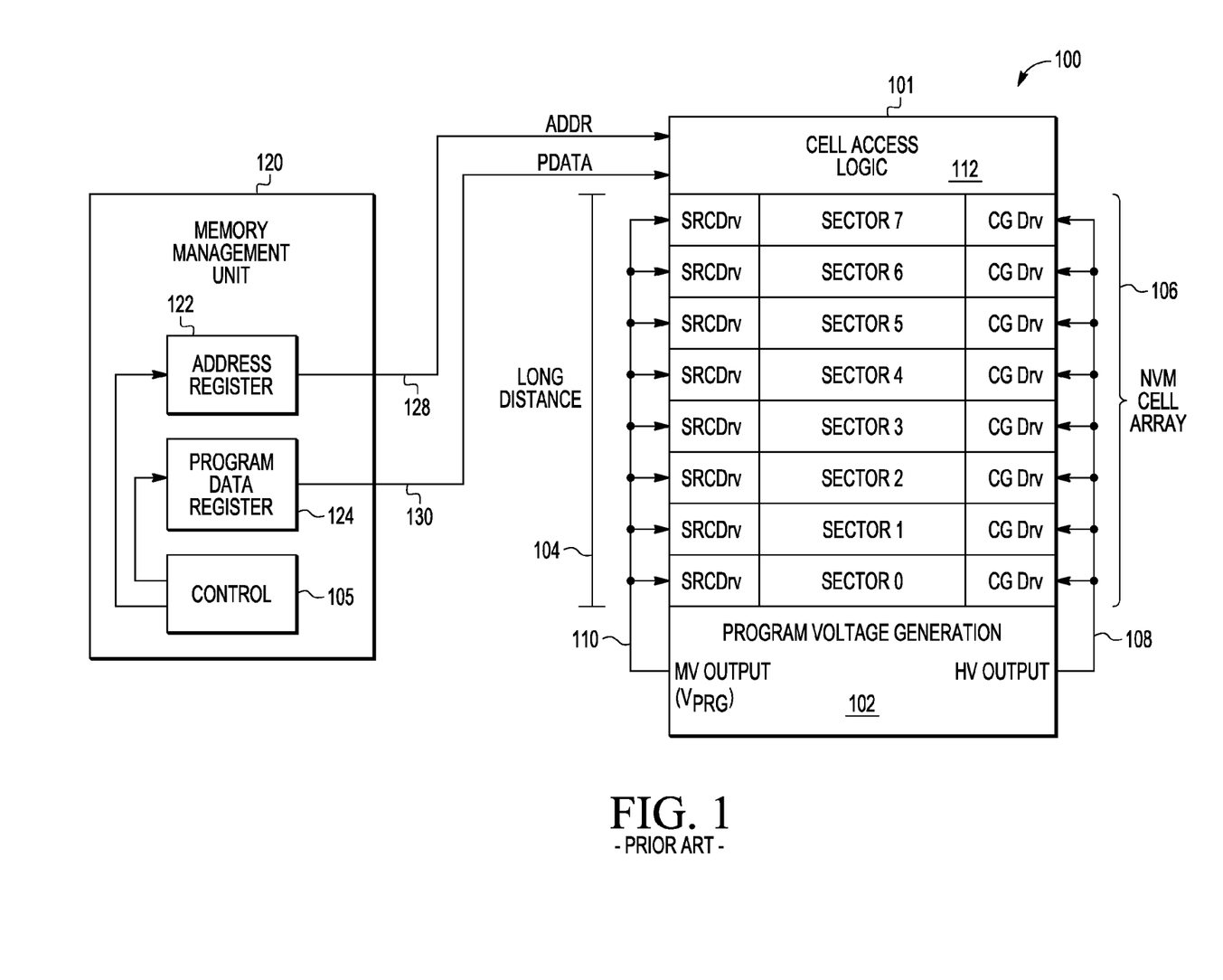

FIG. 1 (Prior Art) is a block diagram of an embodiment 100 for a non-volatile memory (NVM) system including a non-volatile memory 101 controlled by a memory management unit 120. The non-volatile memory 101 includes cell access logic circuitry 112, program voltage generation circuitry 102, and an NVM cell array 106. The NVM cell array 106 includes eight sectors (e.g., SECTOR0, SECTOR1... SECTOR7) of split-gate thin film storage (SGTFS) NVM cells, which include control gates, select gates, sources, and drains The memory management unit 120 includes an address register 122 that provides an address (ADDR) 128 to the cell access logic circuitry 101 that is used to select the cells to be accessed and programmed with the NVM cell array 106. The memory management unit 120 also includes a program data register 124 that provides the program data (PDATA) 130 that is used to program the cells selected for programming. Further, the memory management unit 120 includes control block 105 that is configured to control programming operations for the NVM system. During operation, the address 128 selects cells to be programmed within one of the sectors for the NVM cell array 106. As one example embodiment, the NVM cell array 106 can include a plurality of rows of cells; each row can have 144 cells (i.e., 144 bits), and the program data 130 can be 144 bits with zero values representing cells to be programmed and one values representing cells not to be programmed.

Within the NVM cell array 106, each sector further includes a control gate driver (CGDrv) and a source gate driver (SRCDrv). Each control gate driver (CGDrv) applies a high voltage (HV) output signal from the program voltage generation circuitry 102 to cells within the sector that have been selected for programming. A distribution line 108 feeds the HV output signal to control gate drivers. Each source gate driver (SRCDrv) applies a medium voltage (MV) output signal ($V_{PRG}$) from the program voltage generation circuitry 102 to cells within the sector that have been selected for programming. A distribution line 110 feeds the MV output signal ($V_{PRG}$) to the source gate drivers. As the source gate nodes are relatively low impedance nodes, a high current will travel along the distribution line 110. Due to the different distances and potentially long distance 104 (e.g., 2.2 millimeters) that this current will travel along distribution line 110, for example to SECTOR7, different and potentially large IR (current-resistance) voltage drops will occur. As such, the voltages actually applied to the NVM cells through the source drivers can be less than the desired program voltage level. For example, a MV output signal ($V_{PRG}$) generated and output by the program voltage generator circuitry 102 at 6.0 volts may drop by 0.2 volts to 5.8 volts by the time it reaches SECTOR7 at the end of the distribution line 110. This voltage drop will be dependent upon the number of cells being programmed and the length along distribution line 110 that the programming currents will travel. As the control gate nodes are relatively high impedance nodes, the IR voltage drop along the distribution line 108 is not significant.

Figure 2:
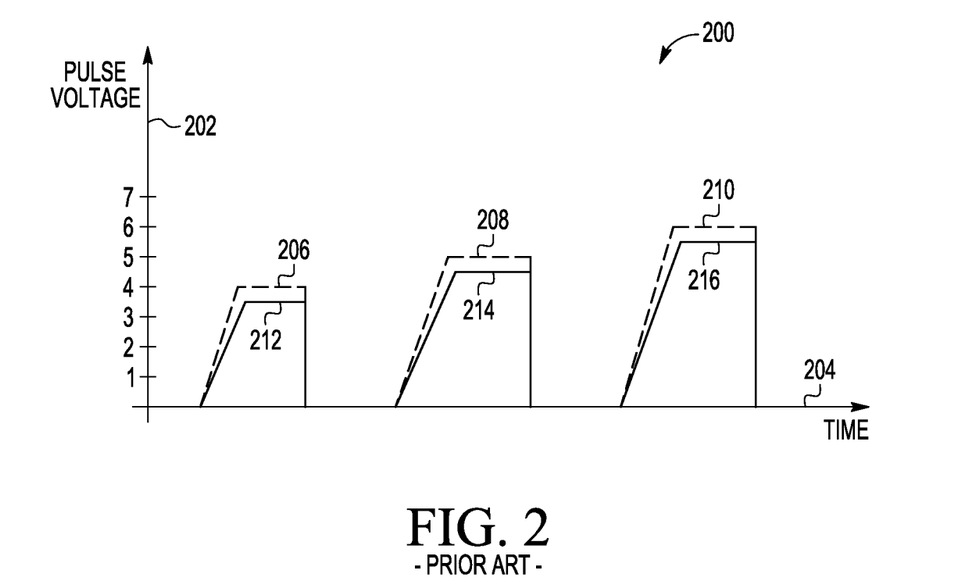
FIG. 2 (Prior Art) is a voltage level diagram for representative variations in program pulse voltages due to IR (current-resistance) voltage losses experienced in distributing program voltages to source drivers within an NVM array.

FIG. 2 (Prior Art) is a voltage level diagram 200 for representative variations in program pulse voltages due to IR voltage losses experienced in distributing program voltages to source drivers within an NVM array. The x-axis 204 represents time, and the y-axis 202 represents pulse voltage. For the embodiment 200, three program pulses are shown. Pulse voltage levels 206, 208, and 210 represent desired pulse voltage levels for pulses that ramp to 4.0 volts, 5.0 volts, and 6.0 volts, respectively. Actual voltage pulses 212, 214, and 216 do not reach the desired voltage levels due to IR voltage losses. For example, an IR voltage loss of about 0.1 volts can be experienced when the MV output signal ($V_{PRG}$) of FIG. 1 is used to drive source nodes for 72 cells at 1 milli-Amp (mA) through program voltage drivers located at the end of a voltage distribution line that is 2.2 millimeters (mm). It is noted that the sheet resistance for the distribution line, the sector selected, and the current level will affect this IR loss. It is also noted that the current level is determined by the number of cells selected for programming within the NVM array.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of an embodiment for an non-volatile memory (NVM) system including a non-volatile memory controlled by a memory management unit.

DETAILED DESCRIPTION

Methods and systems are disclosed for digital control for regulation of program voltages for non-volatile memory (NVM) systems. The disclosed embodiments dynamically adjust program voltages based upon parameters associated with the cells to be programmed in order to account for IR (current-resistance) voltage drops that occur within program voltage distribution lines. Other voltage variations can also be accounted for with these dynamic adjustments, as well. The parameters for cells to be programmed can include, for example, cell address locations for the cells to be programmed, the number of cells to be programmed, and/or other desired parameters associated with the cells to be programmed. The disclosed embodiments use digital control values obtained from lookup tables based upon the cell parameters to adjust output voltages generated by voltage generation circuit blocks used to program the selected cells thereby tuning the program output voltage level to a predetermined desired level. These dynamic adjustments effectively overdrive the IR drop and gates for the cells being programmed so that the desired program voltages are achieved. Different features and variations can be implemented, as desired, and related or modified systems and methods can be utilized, as well.

Figure 3:
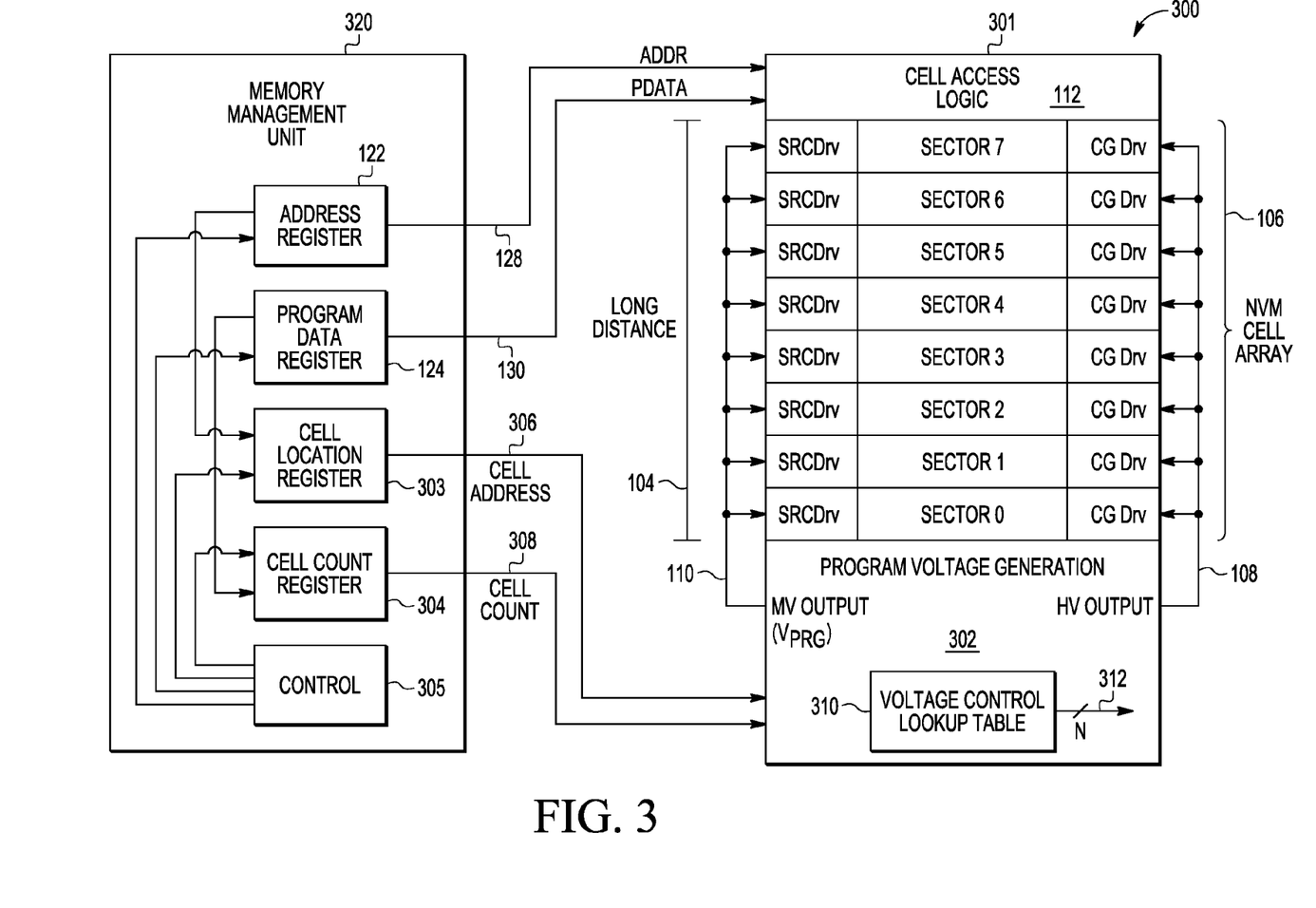
FIG. 3 is a block diagram of an embodiment for an non-volatile memory (NVM) system including a voltage control lookup table that provides a digital control value to dynamically adjust programming voltages based upon the cells to be programmed.

FIG. 3 is a block diagram of an embodiment 300 for an non-volatile memory (NVM) system including a voltage control lookup table 310 that provides a digital control value 312 to dynamically adjust programming voltages based upon the cells to be programmed. Similar to embodiment 100 of FIG. 1 (Prior Art), the NVM system 300 includes a non-volatile memory 301 controlled in part by a memory management unit 320. However, in addition to an address register 122 and a program data register 124, the memory management unit 320 also includes a cell location register 303 and a cell count register 304 that provide dynamic parameters associated with the cells to be programmed to the program voltage generation circuitry 302 for the non-volatile memory 301. The program voltage generation circuitry 302 uses these cell parameters to select digital control values 312 from the voltage control lookup table 310. These digital control values 312 are then used to adjust programming output voltages based. As such, the program voltage ($V_{PRG}$) is effectively controlled based upon parameters associated with the cells to be programmed. It is noted that the memory management unit 320 also includes control block 305 that is configured to control programming operations for the NVM system. It is further noted that the non-volatile memory 301 also includes cell access logic circuitry 112 and NVM cell array 106, which are described above.

In operation, the program voltage generation circuitry 302 receives the cell address 306 from the cell location register 303 that indicates the address for the cells that will be programmed. The cell address information stored in the cell location register 303 is determined based upon the contents of the address register 122. This cell address information can be, for example, a row address for a row that will be accessed within one of the sectors for the NVM cell array 106 in order to program the cells to be programmed, and this row address can be determined from address information stored in the address register 122. For one further example embodiment, the address information in the address register 122 includes row and column information, the cell address information in the cell location register includes only the row address. The cell address 306 output by the cell location register 302 can be, for example, a multiple bit word identifying the row address for the cells that will be programmed. For example, an 8-bit address can be used for the cell location register 302 to determine the row within which the cells will be programmed, and this 8-bit address can be determined from a 15-bit address stored in the address register 122. Other variations could also be implemented.

The program voltage generation circuitry 302 also receives cell count 308 from the cell count register 304 that indicates the number of cells that will be programmed. The cell count information stored in the cell count register 304 is determined based upon the contents of the program data register 124. The program data register 124, for example, can include a bit for each cell within a row of cells for the NVM cell array 106. One logic level (e.g., low logic level) can be used to indicate that the cell associated with the bit will be programmed within the row, and another logic level (e.g. high logic level) can be used to indicate that the cell associated with the bit will not be programmed within the row. For such an implementation, the cell count to be stored within the cell count register 304 can be determined by counting the number of bits within the program data register 124 that are set as indicating cells will be programmed. For example, if the program data register 124 is 144 bits in length and a low logic level is to indicate that a cell will be programmed, then the number of bits having this low logic level can be counted to determine how many of the 144 cells within a row will be programmed. Other variations could be implemented, as desired, while still providing a count of the number of cells being programmed using the program voltage generated by the program voltage generation circuitry 302.

As with embodiment 100 of FIG. 1 (Prior Art), the NVM cell array 106 for embodiment 300 of FIG. 3 includes eight sectors (e.g., SECTOR0, SECTOR1 . . . SECTOR7) of split-gate thin film storage (SGTFS) NVM cells, which include control gates, select gates, sources, and drains It is noted, however, that different NVM cell array configurations could be utilized, as desired, including different numbers of sectors, different cell types, and/or other variations. Each sector further again includes a control gate driver (CGDrv) that applies a high voltage (HV) output signal from the program voltage generation circuitry 102 to cells selected for programming, and each source gate driver (SRCDrv) applies a medium voltage (MV) output signal ($V_{PRG}$) from the program voltage generation circuitry 102 to cells selected for programming. A distribution line 108 feeds the HV output signal to control gate drivers, and a distribution line 110 feeds the MV output signal ($V_{PRG}$) to the source gate drivers. As indicated above, due to the different distances and potentially long distance 104 (e.g., 2.2 millimeters) that the program voltage ($V_{PRG}$) signal will travel along distribution line 110, for example to SECTOR7, different and potentially large IR (current-resistance) voltage drops will occur. Advantageously, this voltage drop is accounted for by the dynamic adjustments provided through the operation of the voltage control lookup table 310.

Figure 4:
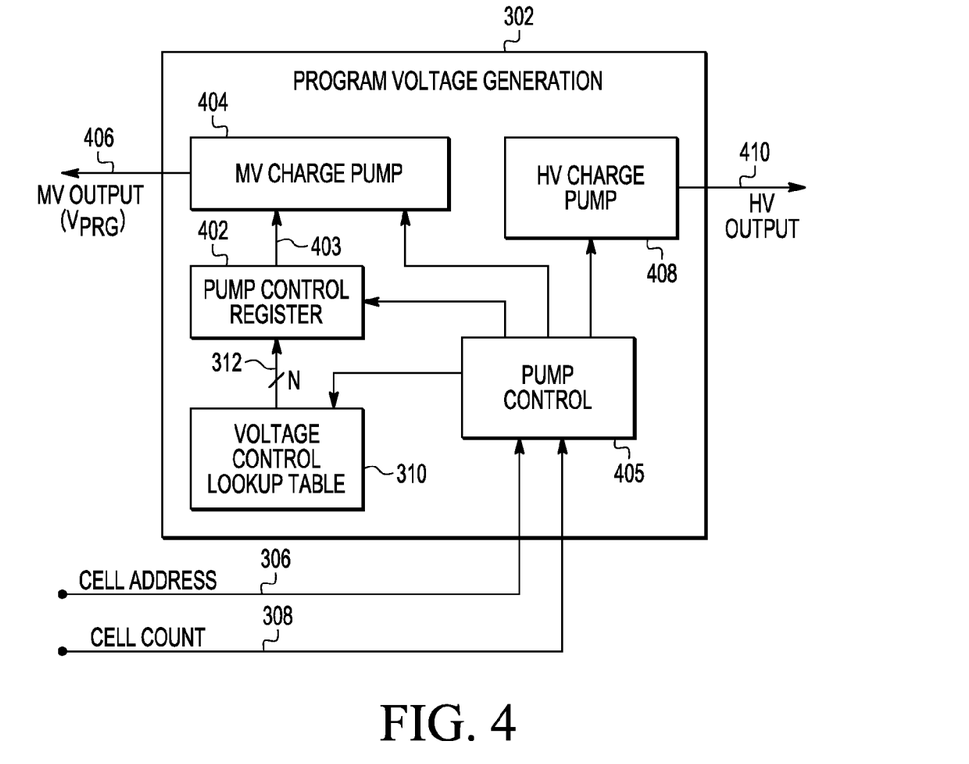
FIG. 4 is a block diagram of an embodiment for program voltage generation circuitry that includes a voltage control lookup table.

FIG. 4 is a block diagram of an embodiment for program voltage generation circuitry 302 that includes a voltage control lookup table 310. As depicted, a pump control block 405 receives the cell address 306 and the cell count 308 and uses these cell programming parameters to perform a lookup within the voltage control lookup table 310. As indicated above, the cell address 306 represents the address for the cells that will be programmed, and the cell count 308 represents the number of cells that will be programmed. Based upon these parameters associated with the cells to be programmed and an associated lookup operation, the digital control value 312 is selected from the voltage control lookup table 310. This digital control value 312 can be, for example, a multiple bit value (e.g., N-bit value) that is provided to the pump circuitry to control the voltage level output by the pump circuitry. For the embodiment depicted, the digital control value 312 is selected from the lookup table 310 and stored within the pump control register 402. The pump control register 402 in turn provides a control signal 403 to the MV charge pump 404. The control signal 403 can be, for example, the same as the digital control value 312 or another control signal based upon the digital control value 312. This control signal 403 is configured to provide variable control of the output voltage level for the MV output voltage ($V_{PRG}$) 406 generated by the MV charge pump 404. As indicated above, where split-gate NVM cells are used, a second HV charge pump 408 is used to generate a HV output voltage 410 for control gate drivers (CGDrv) associated with the sectors. While similar dynamic control of the output voltage levels for the HV charge pump 408 could be also be provided, if desired, this control is typically not needed as control gates for split-gate NVM cells are usually capacitive loads that draw small currents. As such, the IR voltage drops within the distribution line 108 are typically not significant. It is further noted that where NVM cells, such as floating gate NVM cells, are used that are not split-gate NVM cells, only a single program voltage can be generated by the program voltage generation circuitry 302.

Figure 5:
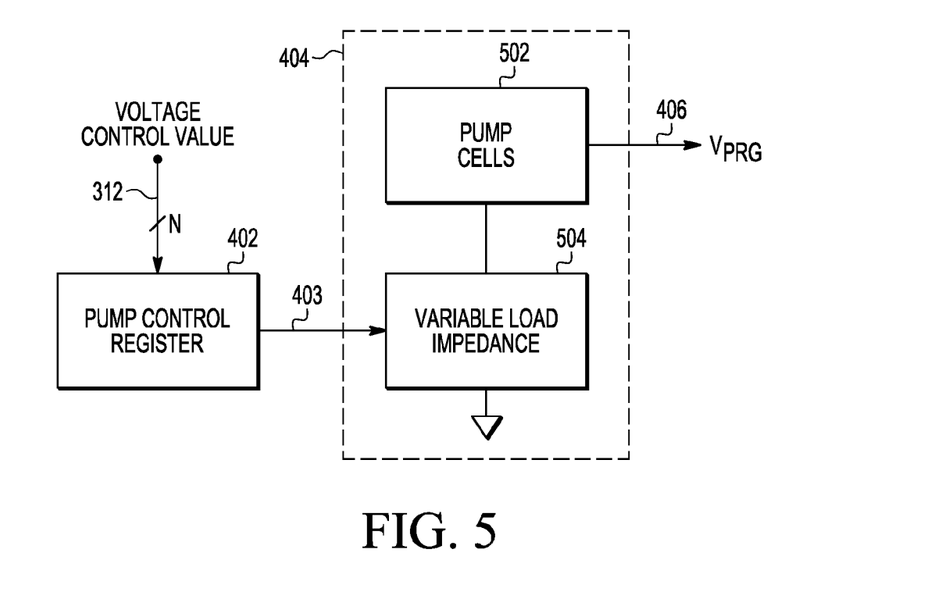
FIG. 5 is a block diagram of an embodiment for voltage generation circuitry that provides an output voltage that varies based upon the multiple-bit digital control value.

FIG. 5 is a block diagram of an embodiment for a charge pump 404 that provides an output voltage ($V_{PRG}$) 406 that varies based upon the multiple-bit digital control value 312. The charge pump 404 includes one or more pump cells 502 that generate a program voltage ($V_{PRG}$) 406 that is distributed along distribution line 110 to the select gates for cells to be programmed, as shown with respect to FIG. 3. The voltage level for this program voltage ($V_{PRG}$) 406 is dependent upon a variable load impedance 504. The variable load impedance 504 is in turn controlled by the pump control signal 403 from the pump control register 402 which stores the digital control value 312. As indicated above, the pump control signal 403 can be the same as the digital control value 312, if desired. For example, the digital control value 312 and the pump control signal 403 can be a multiple-bit control word where each bit is used to adjust one or more impedances within the variable load impedance 504 in order to vary the output voltage level for the program voltage ($V_{PRG}$) 406.

For one implementation using the embodiments shown in FIGS. 3-5, the digital control value 312 can be a 16-bit value that adjusts the program voltage. The TABLE below provides an example voltage control lookup table 310 that provides digital control values 312 based upon the cell address 306 as a first key and the cell count 308 as a second key. The representative program voltage value ($V_{PRG}$) 406 that is ultimately generated by the charge pump 404 is also shown. It is noted that the digital control values 312 are set forth as hexadecimal representations while the cell address 306 and the cell count 308 are set forth as binary representations. For this TABLE, it is assumed that the desired voltage level at the cells being programmed is 6.0 volts. It is also assumed that cell address values are within a range from 0 to 255 (e.g., based upon an 8-bit address), and the number of cells that can be programmed at a time is within a range from 0 to 144 cells (e.g., 144 cells per row within the sectors for the NVM cell array 106). Other target voltages levels, address values, numbers of programmable cells, and/or other parameters could be used, as desired, while still dynamically controlling the program voltages using a digital control value based upon parameters associated with the cells being programmed.

TABLE

EXAMPLE VOLTAGE CONTROL LOOKUP TABLE
WITH REPRESENTATIVE RESULT VOLTAGE LEVELS

| Key1<br>Cell Address<br>Signal 306 | Key2<br>Cell Count<br>Signal 308 | Lookup Value<br>Digital Control<br>Value 312 | Result<br>Program Voltage<br>($V_{PRG}$) 406 |
|---|---|---|---|
| 0000_0000 | 0000_0001 | 0001 | 6.0 volts |
| ... | ... | ... | ... |
| 0000_0010 | 0010_0000 | 0A00 | 6.1 volts |
| ... | ... | ... | ... |
| 1111_1111 | 0000_0100 | 0008 | 6.2 volts |
| ... | ... | ... | ... |
| 1111_1111 | 1001_0000 | FFFF | 6.56 volts |

It is noted that for the TABLE above, only four entries are shown although it should be understood that entries could be included to cover each possible combination of an 8-bit cell address and cell count value. It is further noted that the digital control values can be programmed into the lookup table, for example, based upon testing conducted during manufacturing and/or based upon other considerations as desired. Looking to the TABLE, the first entry has address 0 with one (1) cell being programmed. The related lookup value for the digital control value is hex 0001, and this hex value is configured to cause the charge pump to generate an output voltage level of 6.0 volts. The second entry has address 2 with thirty-two (32) cells being programmed. The related lookup value for the digital control value is hex 0A00, and this hex value is configured to cause the charge pump to generate an output voltage level of 6.1 volts. The third entry has address 255 with eight (8) cells being programmed.

The related lookup value for the pump control signal is hex 0008, and this hex value is configured to cause the charge pump to generate an output voltage level of 6.2 volts. The fourth entry has address 255 with one hundred forty-four (144) cells being programmed. The related lookup value for the digital control signal is hex FFFF, and this hex value is configured to cause the charge pump to generate an output voltage level of 6.56 volts. It is noted that this last entry is directed to the last row address, and all cells within that row are to be programmed (e.g., assuming there are 144 cells per row). As such, the control value is set to the maximum hex value of FFFF which achieves the maximum program voltage for the charge pump of 6.56 volts. In one embodiment, the 16-bit value used for the digital control value can be configured to adjust the output program voltage in 5 millivolts steps over a range from 4.0 volts to 6.56 volts. Other configurations and values could be used for the lookup table, as desired, while still dynamically controlling the program voltages using a digital control value based upon the cells being programmed.

Figure 6:
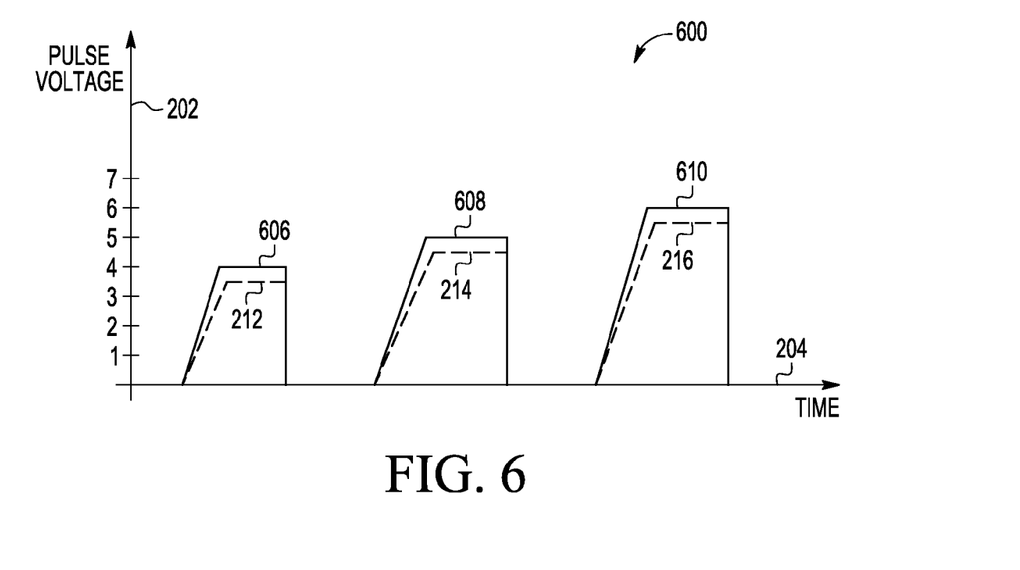
FIG. 6 is a voltage level diagram for representative program pulse voltages that have been dynamically adjusted using digital control values as described herein.

FIG. 6 is a voltage level diagram 600 for representative program pulse voltages that have been dynamically adjusted using digital control values as described herein. As with embodiment 200 of FIG. 2 (Prior Art), the x-axis 204 represents time, and the y-axis 202 represents pulse voltage. For the embodiment 600, three representative program pulses 606, 608, and 610 are shown. The pulse voltage levels for these pulses 606, 608, and 610 represent desired pulse voltage levels for pulses that ramp to 4.0 volts, 5.0 volts, and 6.0 volts, respectively. Desired pulse voltage levels are achieved despite IR drops by dynamically adjusting the program voltages using digital control values based upon the cells being programmed, as described herein. In contrast, without this dynamic adjustment, representative voltage pulses 212, 214, and 216 would instead be achieved that do not reach the desired voltage levels due to IR voltage losses, as also shown with respect to embodiment 200 of FIG. 2 (Prior Art).

Figure 7:
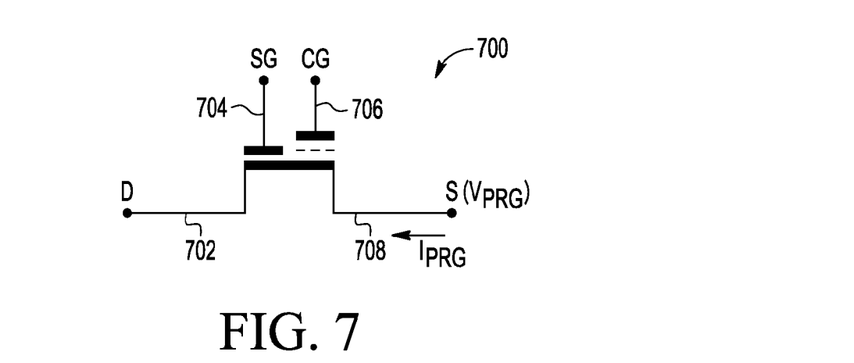
FIG. 7 is a diagram of an embodiment for a split-gate NVM cell that could be used for the NVM arrays described herein.

FIG. 7 is a diagram of an embodiment 700 for a split-gate NVM cell that could be used for the NVM arrays described herein. The NVM cell includes a drain (D) 702, which provides the bit line data connection for the NVM cell. The NVM cell also includes a select gate (SG) 704 and a control gate (CG) 706 that is positioned above a charge storage layer. The NVM cell further includes a source (S) 708. The source (S) 708 is the program node and is driven with the program voltage ($V_{PRG}$) and a program current ($I_{PRG}$) when the split-gate NVM cell is being programmed.

Figure 8:
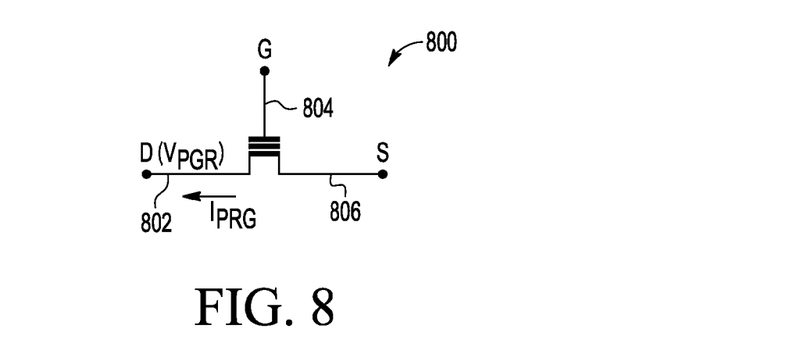
FIG. 8 is a diagram of an embodiment for a floating gate NVM cell that could be used for the NVM arrays described herein.

FIG. 8 is a diagram of an embodiment 800 for a floating gate NVM cell that could be used for the NVM arrays described herein. The NVM cell includes a drain (D) 802, which provides the bit line data connection for the NVM cell. The NVM cell also includes a gate (G) 804 that is positioned above a floating gate. The NVM cell further includes a source (S) 806. The drain (D) 802 is the program node and is driven with the program voltage ($V_{PRG}$) and a program current ($I_{PRG}$) when the floating-gate NVM cell is being programmed.

Figure 9:
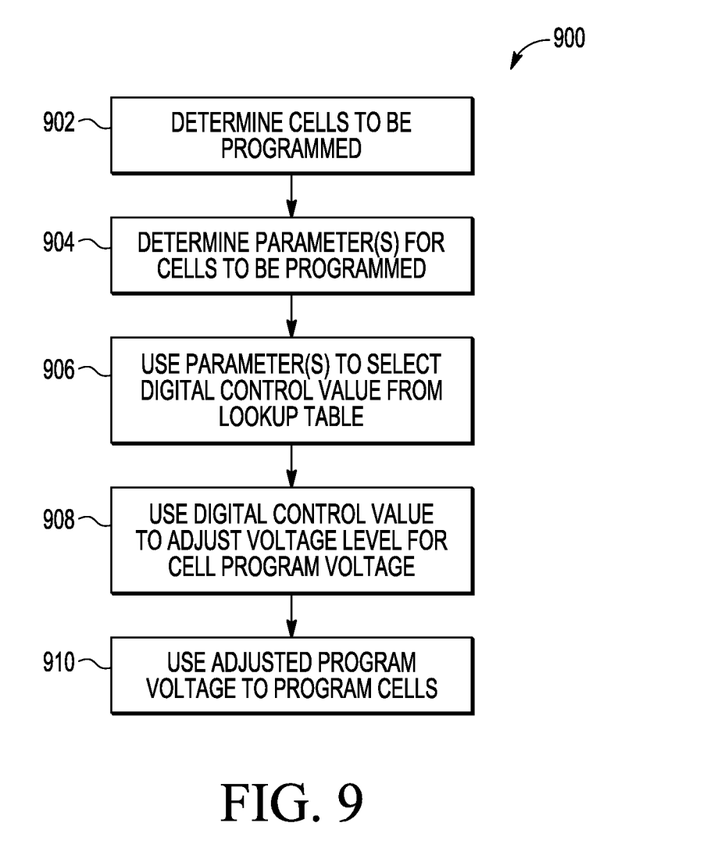
FIG. 9 is a process flow diagram of an embodiment for dynamically adjusting voltage levels for cell program voltages using parameters associated with cells to be programmed.

FIG. 9 is a process flow diagram of an embodiment 900 for dynamically adjusting voltage levels for cell program voltages using parameters associated with cells to be programmed. In step 902, the cells to be programmed within the NVM cell array are determined. In step 904, one or more parameters are determined for the cells to be programmed. As described herein, these cell parameters can include an address for the cells to be programmed, the number of cells being programmed, and/or any other desired parameter associated with the cells being programmed. In step 906, the parameter(s) are used to select a digital control value from a lookup table. As described herein, the digital control values stored within the lookup table can be configured to adjust the output voltage levels for the program voltage so as to account for IR losses that are expected to occur within distribution lines feeding the program voltage to the cells to be programmed. Other variations in program voltages due to other factors could also be accounted for in the control values, if desired. In step 908, the digital control value selected form the lookup table is used to adjust the voltage level for the cell program voltage. As described herein, for example, the digital control value can be used to adjust the output voltage generated by a charge pump used to generate the program voltage. In block 910, the adjusted program voltage is used to program the cells that were selected for programming. Variations to the above steps could be implemented, as desired.

As described herein, a variety of embodiments can be implemented and different features and variations can be implemented, as desired.

For one disclosed embodiment, a non-volatile memory (NVM) system includes an array of NVM cells, a lookup table configured to store digital control values associated with at least one NVM cell programming parameter, voltage generation circuitry configured to output a program voltage where the program voltage is dependent upon a digital control value from the lookup table, and a memory management unit configured to generate the at least one NVM cell programming parameter based upon NVM cells to be programmed.

In further embodiments, the digital control values within the lookup table can be selected to counter expected IR (current-resistance) losses in a distribution line for the program voltage. Also, the cell programming parameter can include at least one of an address location for cells to be programmed or a count for a number of cells to be programmed. Still further, the cell programming parameter can include both an address location for cells to be programmed and a count for a number of cells to be programmed. In additional embodiments, the NVM cells can be at least one of split-gate NVM cells or floating gate NVM cells.

In other embodiments, the memory management unit can further include a cell location register configured to store an address location for cells to be programmed, and the cell programming parameter can include the address location. In addition, the memory management unit can further include an address register, and the address location can be based upon at least a portion of an address stored in the address register. For still further embodiments, the memory management unit can further include a cell count register configured to store a count value indicating a number of cells to be programmed, and the programming parameter can include the count value. In addition, the memory management unit can further include a program data register configured to store information identifying cells to be programmed, and the count value can be based upon information stored in the program data register.

In still further embodiments, the voltage generation circuitry can include variable impedance circuitry configured to adjust the program voltage based upon the digital control value from the lookup table. In addition, the voltage generation circuitry can further include a control register configured to store the digital control value and to provide a control signal to the variable impedance circuitry. Still further, the voltage generation circuitry can further include a charge pump including to the variable impedance circuitry. The voltage generation circuitry can also further include an additional charge pump configured to generate an additional program voltage.

For another disclosed embodiment, a 4 method for adjusting program voltages for a non-volatile memory (NVM) system includes determining at least one cell programming parameter associated with at least one NVM cell to be programmed within an array of NVM cells, selecting a digital control value from a lookup table using the at least one cell programming parameter where the lookup table is storing digital control values associated with cell programming parameters, adjusting a program voltage based upon the selected digital control value, and programming the at least one NVM cell using the adjusted program voltage.

In further embodiments, the digital control values within the lookup table can be selected to counter expected IR (current-resistance) losses in a distribution line for the program voltage. Also, the cell programming parameter can include at least one of an address location for cells to be programmed or a count for a number of cells to be programmed. Still further, the cell programming parameter can include both an address location for cells to be programmed and a count for a number of cells to be programmed. In additional embodiments, the NVM cells can be at least one of split-gate NVM cells or floating gate NVM cells.

In other embodiments, the method can further include generating the program voltage using voltage generation circuitry, and the adjusting step can include adjusting variable impedance circuitry for the voltage generation circuitry based upon the selected digital control value to adjust the program voltage. Still further, the voltage generation circuitry can include a charge pump including the variable impedance circuitry.

It is noted that the functional blocks and circuitry described herein can be implemented using hardware, software, or a combination of hardware and software, as desired. In addition, one or more processors or processing circuitry running software and/or firmware can also be used, as desired, to implement the disclosed embodiments. It is further understood that one or more of the operations, tasks, functions, or methodologies described herein may be implemented, for example, as software or firmware and/or other program instructions that are embodied in one or more non-transitory tangible computer readable mediums (e.g., memory) and that are executed by one or more controllers, microcontrollers, microprocessors, hardware accelerators, and/or other processors or processing devices to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A non-volatile memory (NVM) system, comprising:
   an array of NVM cells;
   a lookup table configured to store digital control values associated with cell programming parameters including count values;
   voltage generation circuitry configured to output a program voltage to the array of NVM cells, the program voltage being dependent upon a digital control value selected from the lookup table based upon at least one cell programming parameter including a count value of a number of NVM cells to be programmed; and
   a memory management unit configured to generate the at least one cell programming parameter including the count value for the voltage generation circuitry based upon NVM cells to be programmed.

2. The NVM system of claim 1, wherein the digital control values within the lookup table are selected to counter expected IR (current-resistance) losses in a distribution line for the program voltage.

3. The NVM system of claim 1, wherein the at least one cell programming parameter further comprises an address location for cells to be programmed in addition to the count value for the number of NVM cells to be programmed.

4. The NVM system of claim 1, wherein the memory management unit further comprises a cell location register configured to store an address location for cells to be programmed, and wherein the at least one cell programming parameter further comprises the address location.

5. The NVM system of claim 4, wherein the memory management unit further comprises an address register, and wherein the address location is based upon at least a portion of an address stored in the address register.

6. The NVM system of claim 1, wherein the memory management unit further comprises a cell count register configured to store the count value indicating a number of cells to be programmed.

7. The NVM system of claim 6, wherein the memory management unit further comprises a program data register configured to store information identifying cells to be programmed, and wherein the count value is based upon information stored in the program data register.

8. The NVM system of claim 1, wherein the voltage generation circuitry comprises variable impedance circuitry configured to adjust the program voltage based upon the digital control value from the lookup table.

9. The NVM system of claim 8, wherein the voltage generation circuitry further comprises a control register configured to store the digital control value and to provide a control signal to the variable impedance circuitry.

10. The NVM system of claim 8, wherein the voltage generation circuitry further comprises a charge pump including to the variable impedance circuitry.

11. The NVM system of claim 10, wherein the voltage generation circuitry further comprises an additional charge pump configured to generate an additional program voltage.

12. The NVM system of claim 1, wherein the NVM cells comprise at least one of split-gate NVM cells or floating gate NVM cells.

13. A method for adjusting program voltages for a non-volatile memory (NVM) system, comprising:
    determining at least one cell programming parameter associated with at least one NVM cell to be programmed within an array of NVM cells, the at least one cell programming parameter including a count value of a number of NVM cells to be programmed;
    selecting a digital control value from a lookup table using the at least one cell programming parameter including the count value, the lookup table storing digital control values associated with cell programming parameters including count values;
    adjusting a program voltage based upon the selected digital control value; and
    programming the at least one NVM cell using the adjusted program voltage.

14. The method of claim 13, wherein the digital control values within the lookup table are selected to counter expected IR (current-resistance) losses in a distribution line for the program voltage.

15. The method of claim 13, wherein the at least one cell programming parameter further comprises an address location for cells to be programmed in addition to the count value for the number of NVM cells to be programmed.

16. The method of claim 13, further comprising generating the program voltage using voltage generation circuitry, and wherein the adjusting step comprises adjusting variable impedance circuitry for the voltage generation circuitry based upon the selected digital control value to adjust the program voltage.

17. The method system of claim 16, wherein the voltage generation circuitry comprises a charge pump including the variable impedance circuitry.

18. The method of claim 13, wherein the NVM cells comprise at least one of split-gate NVM cells or floating gate NVM cells.

* * * * *